(12) United States Patent
Bustraan et al.

(10) Patent No.: US 11,003,095 B2
(45) Date of Patent: May 11, 2021

(54) POSITIONING SYSTEM AND LITHOGRAPHIC APPARATUS

(71) Applicants: ASML NETHERLANDS B.V., Veldhoven (NL); ASML HOLDING N.V., Veldhoven (NL)

(72) Inventors: Krijn Frederik Bustraan, Eindhoven (NL); Yang-Shan Huang, Veldhoven (NL); Antonius Franciscus Johannes De Groot, Lierop (NL); Minkyu Kim, Ridgefield, CT (US); Jasper Anne Frido Marikus Simons, Eindhoven (NL); Theo Anjes Maria Ruijl, Eindhoven (NL); Ronald Josephus Maria Lamers, Budel (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/332,002

(22) PCT Filed: Aug. 31, 2017

(86) PCT No.: PCT/EP2017/071870
§ 371 (c)(1),
(2) Date: Mar. 11, 2019

(87) PCT Pub. No.: WO2018/050443
PCT Pub. Date: Mar. 22, 2018

(65) Prior Publication Data
US 2019/0219932 A1    Jul. 18, 2019

Related U.S. Application Data

(60) Provisional application No. 62/394,124, filed on Sep. 13, 2016.

(51) Int. Cl.
*G03F 7/20* (2006.01)

(52) U.S. Cl.
CPC ...... *G03F 7/70766* (2013.01); *G03F 7/70725* (2013.01); *G03F 7/70758* (2013.01); *G03F 7/70775* (2013.01)

(58) Field of Classification Search
CPC ............ G03F 7/70766; G03F 7/70725; G03F 7/70758; G03F 7/70775; G03F 7/70716;
(Continued)

(56) References Cited

U.S. PATENT DOCUMENTS 6,157,159 A * 12/2000 Korenaga ........... G03F 7/70358
108/20
2001/0004105 A1    6/2001 Kwan et al.
(Continued)

FOREIGN PATENT DOCUMENTS

CN    101405838    4/2009
CN    101510052    8/2009
(Continued)

OTHER PUBLICATIONS

International Search Report and Written Opinion issued in corresponding PCT Patent Application No. PCT/EP2017/071870, dated Dec. 13, 2017.
(Continued)

*Primary Examiner* — Christina A Riddle
(74) *Attorney, Agent, or Firm* — Pillsbury Winthrop Shaw Pittman LLP

(57) ABSTRACT

A positioning system for positioning an object. The positioning system includes a stage, a balance mass and an actuator system. The stage is for holding the object. The actuator system is arranged to drive the stage in a first direction while driving the balance mass in a second direction opposite to the first direction. The stage is moveable in
(Continued)

the first direction in a movement range. When the stage is moving in the first direction and is at an end of the movement range, the positioning system is arranged to collide the stage frontally into the balance mass.

22 Claims, 4 Drawing Sheets

(58) Field of Classification Search
CPC .. G03F 7/70733; G03F 7/7085; G03F 7/7095; G03F 7/70991; G03F 7/709; G03F 7/70258; H01L 21/027
USPC .... 355/52, 53, 55, 72–77; 250/492.1, 492.2, 250/492.22, 493.1
See application file for complete search history.

(56) References Cited

U.S. PATENT DOCUMENTS

| | | | |
|---|---|---|---|
| 2001/0006762 A1* | 7/2001 | Kwan | G03F 7/70716 430/311 |
| 2004/0031932 A1* | 2/2004 | Vosters | G03F 7/70716 250/492.1 |
| 2005/0073668 A1* | 4/2005 | Ohishi | G03F 7/70716 355/72 |
| 2008/0032066 A1 | 2/2008 | Stiblert et al. | |
| 2008/0094593 A1* | 4/2008 | Shibazaki | G03F 7/70725 355/53 |
| 2009/0201477 A1 | 8/2009 | Butler | |
| 2010/0265487 A1 | 10/2010 | Smeets | |
| 2011/0141449 A1 | 6/2011 | Seijger et al. | |
| 2015/0070678 A1 | 3/2015 | Cadee et al. | |
| 2015/0098074 A1 | 4/2015 | Rosa et al. | |
| 2015/0103329 A1* | 4/2015 | Hoshino | G03F 7/70725 355/72 |

FOREIGN PATENT DOCUMENTS

| | | |
|---|---|---|
| CN | 10157165 | 11/2009 |
| CN | 104238273 | 12/2014 |
| JP | 2001110699 | 4/2001 |
| JP | 2004040106 | 2/2004 |
| JP | 2006303312 | 11/2006 |
| JP | 2009528561 | 8/2009 |
| JP | 2009252993 | 10/2009 |
| JP | 2014232753 | 12/2014 |
| TW | 200746343 | 12/2007 |
| WO | 2013186136 | 12/2013 |

OTHER PUBLICATIONS

Japanese Office Action issued in corresponding Japanese Patent Application No, 2019-508208, dated Feb. 27, 2020.
Chinese office Action issued in corresponding Chinese Patent Application No. 201780055152.3, dated Jun. 28, 2020.

* cited by examiner

POSITIONING SYSTEM AND LITHOGRAPHIC APPARATUS

CROSS REFERENCE TO RELATED APPLICATIONS

This application is the U.S. national phase entry of PCT patent application no. PCT/EP2017/071870, which was filed on Aug. 31, 2017, which claims the benefit of priority of U.S. provisional application No. 62/394,124, which was filed on Sep. 13, 2016, and which is incorporated herein in its entirety by reference.

FIELD

The present description relates to a positioning system and a lithographic apparatus comprising the positioning system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

To improve the throughput of a lithographic apparatus, there is a trend to increase the speed and acceleration of the stages that respectively hold the patterning device and the substrate. By increasing the speed and acceleration of the stages, the patterning device and the target portions on the substrate can be moved faster through the radiation beam, so more target portions can be exposed per unit of time.

SUMMARY

In a known lithographic apparatus, the optical system, that images the pattern onto the target portion, typically reduces the image with a factor of 4. This means that the patterning device needs to move 4 times faster than the substrate. New developments are ongoing to change the factor of 4 to a higher factor, e.g., a factor of 10. This means that the patterning device needs to move 10 times faster than the substrate.

Due to the increasing speed and acceleration of the stage, the amount of kinetic energy stored in the stage is increased. In case of an emergency, for example a software error, the stage may move uncontrollably and collide with a part of the lithographic apparatus. The part of the lithographic apparatus may need to absorb part or all of the kinetic energy of the stage.

A lithographic apparatus can absorb the kinetic energy as disclosed in US patent application publication no. US 2015/0098074, hereby incorporated by reference in its entirety. That lithographic apparatus has a stage assembly, a reaction mass and a stage base. During normal use, the stage assembly moves along the X-axis, Y-axis and about the Z-axis. When the stage assembly is moved by a force, an equal and opposite reaction force is applied to the reaction mass. In an emergency, the stage assembly is urged onto the reaction mass, and the reaction mass is urged onto the stage base, so as to generate a braking force to stop the stage assembly and the reaction mass.

A disadvantage of that lithographic apparatus is that during the emergency, a large force is transmitted throughout the lithographic apparatus. The transmission of the large force may cause one or more sensitive components of the lithographic apparatus to displace or vibrate.

It is desirable, for example, to provide a positioning system that reduces the amount of force transmitted from the positioning system during an emergency.

According to an aspect, there is provided a positioning system for positioning an object, the positioning system comprising a stage, a balance mass and an actuator system. The stage is for holding the object. The actuator system is arranged to drive the stage in a first direction while driving the balance mass in a second direction opposite to the first direction. The stage is moveable in the first direction in a movement range. When the stage is moving in the first direction and is at an end of the movement range, the positioning system is arranged to collide the stage frontally into the balance mass.

According to a further aspect, there is provided a lithographic apparatus comprising a positioning system as described herein, a support structure, a substrate table and a projection system. The support structure is constructed to support a patterning device. The patterning device is capable of imparting a radiation beam with a pattern in its cross-section to form a patterned radiation beam. The substrate table constructed to hold a substrate. The projection system is configured to project the patterned radiation beam onto a target portion of the substrate. The stage of the positioning system comprises one of the support structure and the substrate table. The object of the positioning system comprises one of the patterning device and the substrate.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
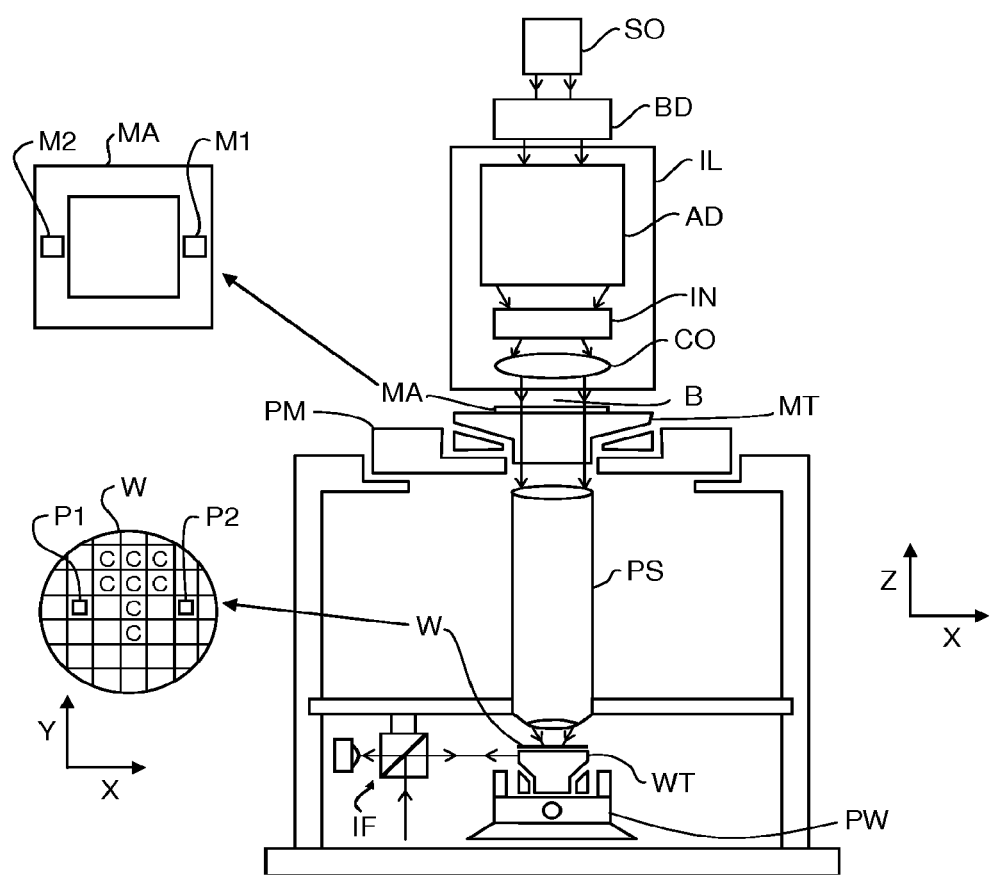
FIG. 1 depicts a lithographic apparatus according to an embodiment.

FIG. 1 schematically depicts a lithographic apparatus according to an embodiment. The lithographic apparatus comprises an illumination system IL, a support structure MT, a substrate table WT and a projection system PS. The illumination system IL is configured to condition a radiation beam B. The support structure MT is constructed to support a patterning device MA and is connected to a first positioning system PM configured to accurately position the patterning device MA in accordance with certain parameters. The substrate table WT is constructed to hold a substrate W, e.g., a resist-coated wafer, and is connected to a second positioning system PW configured to accurately position the substrate W in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The illumination system IL receives the radiation beam B from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two (dual stage) or more substrate tables (and/or two or more patterning device support tables). In such "multiple stage" machines the additional tables may be used in parallel, or preparatory steps may be carried out on one or more tables while one or more other tables are being used for exposure. An additional table may be arranged to hold at least one sensor, instead of holding a substrate W. The at least one sensor may be a sensor to measure a property of the projection system PS, a sensor to detect a position of a marker on the patterning device MA relative to the sensor or may be any other type of sensor. The additional table may comprise a cleaning device, for example for cleaning part of the projection system PS or any other part of the lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The radiation beam B is incident on the patterning device MA, which is held on the support structure MT, and is patterned by the patterning device MA. Having traversed the support structure MT, the radiation beam B passes through the projection system PS, which focuses the beam onto a target portion C of the substrate W. With the aid of the second positioning system PW and position sensor IF (e.g. an interferometric device, linear encoder or capacitive sensor), the substrate table WT can be moved accurately, e.g. so as to position different target portions C in the path of the radiation beam B. Similarly, the first positioning system PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioning system PM. The long-stroke module provides movement of the support structure MT over a large range with limited accuracy (coarse positioning), whereas the short-stroke module provides movement of the support structure MT relative to the long-stroke module over a small range with high accuracy (fine positioning). Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed.

Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C. Substrate alignment marks P1, P2 are known as scribe-lane alignment marks, when they are located in spaces between the target portions C. Similarly, in situations in which more than one die is provided on the patterning device MA, the patterning device alignment marks M1, M2 may be located between the dies.

The depicted apparatus could be used in at least one of the following modes:

In a first mode, the step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In a third mode, the support structure MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus further includes a control unit which controls the actuators and sensors described. The control unit also includes signal processing and data processing capacity to implement desired calculations relevant to the operation of the lithographic apparatus. In practice, the control unit will be realized as a system of many sub-units. Each sub-unit may handle the real-time data acquisition, processing and/or control of component within the lithographic apparatus. For example, one sub-unit may be dedicated to servo control of the second positioning system PW. Separate sub-units may handle the short-stroke module and the long-stroke module, or different axes. Another sub-unit may be dedicated to the readout of the position sensor IF. Overall control of the lithographic apparatus may be controlled by a central processing unit, communicating with the sub-units, with operators and with other apparatuses involved in the lithographic manufacturing process.

Combinations and/or variations on the above described modes of use or entirely different modes of use may also be employed.

Figure 2:
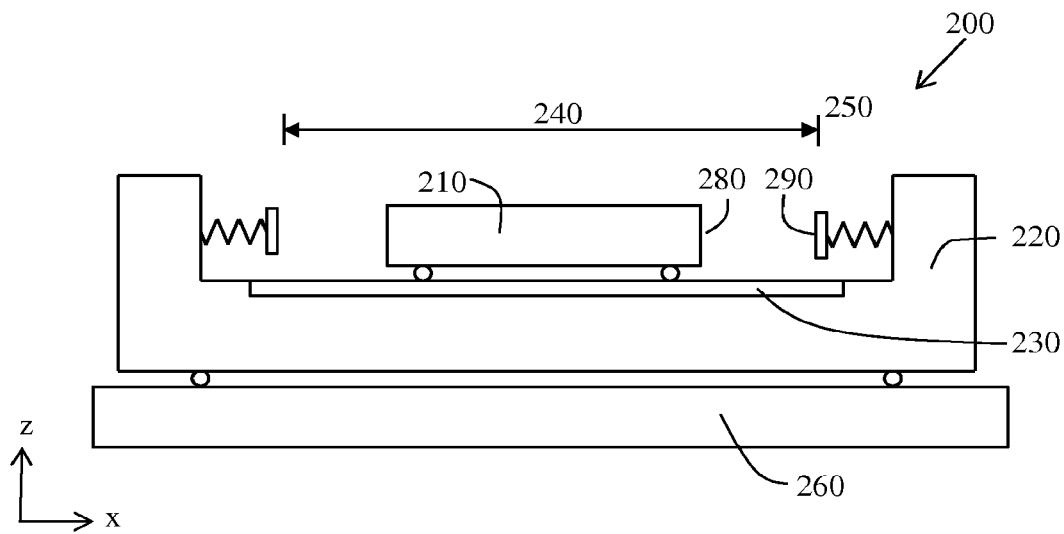
FIG. 2 depicts a positioning system according to an embodiment.

FIG. 2 depicts a positioning system 200, which may comprise the first positioning system PM or the second positioning system PW. The positioning system 200 is configured to position an object, e.g., the patterning device MA or the substrate W. The positioning system 200 comprises a stage 210, a balance mass 220 and an actuator system 230. The stage 210 is configured to hold the object. The actuator system 230 is arranged to drive the stage in a first direction, while driving the balance mass 220 in a second direction opposite to the first direction. The first direction may be the +x direction. The second direction may be the -x direction. The stage 210 is movable in the first direction in a movement range 240. The positioning system 200 is arranged to collide the stage 210 frontally into the balance mass 220, when the stage is moving in the first direction and is at an end 250 of the movement range 240.

The positioning system 200 may comprise a base frame 260 for supporting the balance mass 220. The balance mass 220 is movable relative to the base frame 260 in the second direction. When the actuator system 230 provides a drive force to move the stage 210 in the first direction, the drive force creates a reaction force. Compared with the drive force, the reaction force has an equal magnitude and opposite direction. So when the actuator system 230 moves the stage in the first direction, the balance mass 220 is moved in the second direction. Due to the conservation of momentum, the ratio between the speed of the stage 210 and the speed of the balance mass 220 equals the inverse of ratio between the mass of the stage 210 and the mass of the balance mass 220. Typically, the balance mass 220 has significantly more mass than the stage 210, for example, 5 times or 10 times or 20 times more mass. As a result, the speed of the balance mass 220 is significantly lower than the speed of the stage 210.

The stage 210 has a first surface. When the stage 210 moves in the first direction, the first surface forms a front surface 280. The front surface 280 may be a leading surface. The front surface 280 may be a surface that is closest to the balance mass 220 along the first direction. The balance mass 220 has a second surface 290. The stage 210 is arranged to collide with the front surface 280 into the second surface 290. It may be considered that the stage 210 colliding frontally into the balance mass 220 is the same as the stage 210 colliding with the front surface 280 into the second surface 290 of the balance mass 220.

Figure 3:
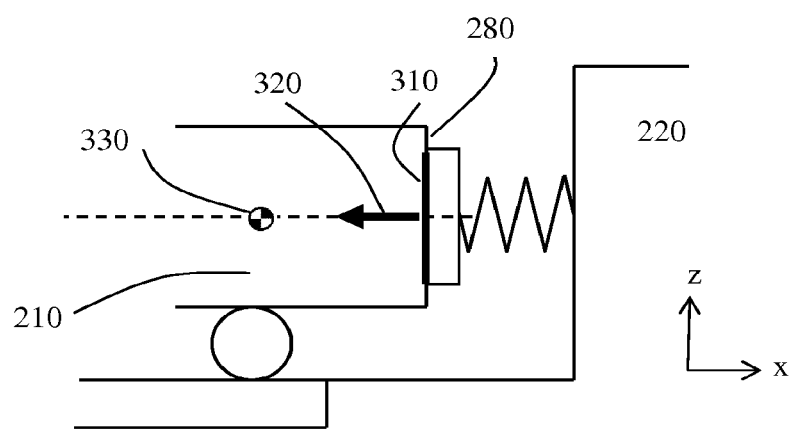
FIG. 3 depicts a detailed view of the positioning system of FIG. 2.

When the stage 210 moves in the first direction, the balance mass 220 moves in the second direction due to the conservation of momentum. An emergency may occur, for example a software error, a position controller malfunction, a position measurement error, etc. During such an emergency, the stage 210 may continue moving in the first direction until the stage 210 reaches the end 250 of the movement range 240. At the end 250, the stage 210 collides with the front surface 280 into the second surface 290. FIG. 3 depicts in more detail when the stage 210 collides with the front surface 280 into the second surface 290.

FIG. 3 depicts the stage 210 colliding into the balance mass 220. The front surface 280 has a contact area 310 for making contact with the second surface 290. When the contact area 310 makes contact with the second surface 290, the second surface 290 applies a crash force 320 on the contact area 310. The crash force 320 decelerates the movement of the stage 210 in the first direction. In case there is only one contact area 310 and there is only one crash force 320, the crash force 320 equals a resultant crash force. In an embodiment, there is more than one contact area 310, and thus there is more than one crash force 320. In that embodiment, the resultant crash force is a single force that is obtained by combining all crash forces 320 in a single force such that the resultant crash force has the same effect on the stage 210 as the crash forces 320. The effect may be the same when the stage 210 is considered to be a rigid body.

When the stage 210 collides into the balance mass 220, the resultant crash force decelerates the stage 210 in the first direction and also decelerates the balance mass in the second direction. Because the stage 210 and the balance mass 220 collide into each other, the momentum of the combination of the stage 210 and the balance mass 220 is conserved. As a result, the amount of resultant crash force transmitted to the base frame 260 is small or even zero. Due to connections to the stage 210 and to the balance mass 220, such as wires and hoses, some amount of resultant crash force may still be transmitted to the base frame 260. Because the amount of the resultant crash force transmitted to the base frame 260 is small, one or more sensitive components that are connected to the base frame 260 are not affected by the resultant crash force. This way it may be prevented, for example, that an optical component of the projection system PS is displaced during a collision of the stage 210 into the balance mass 220. The optical component may be mounted in the projection system PS on an optical holder. The optical component may have a carefully set orientation and/or position in the optical holder or in the projection system PS. If a large resultant crash force would be transmitted to the base frame 260, the carefully set orientation and/or position may be lost. There may be one or more other components of the lithographic apparatus that benefit from a limited amount of the resultant crash force transmitting to the base frame 260. Such one or more other components may comprise a position measurement system and/or a supply system that provides the immersion liquid between the projection system PS and the substrate W. The position measurement system may comprise a scale and an encoder head cooperating with the scale. The scale or the encoder head may be coupled to the base frame 260.

The position measurement system may comprise a plurality of encoder heads. The plurality of encoder heads are arranged on an encoder head frame. The encoder head frame may be coupled to the base frame, for example via a metrology frame. When the stage 210 is at a first position in the movement range 240, a first subset of the plurality of encoder heads is used to determine the position of the stage 210. When the stage 210 moves to a second position in the movement range 240, the position measurement system switches to a second subset of the plurality of encoder heads. The second subset has at least one encoder head different from the first subset. By switching from the first subset to the second subset, the stage 210 may move out of the measurement range of an encoder head and into the measurement range of another encoder head. During switching from the first subset to the second subset, the position measurement system may use both the first subset and the second subset to determine the position of the stage 210.

An intermediate frame may be provided and may be coupled to the base frame 260. The intermediate frame may support the one or more components of the lithographic apparatus such as the scale, the encoder head, the supply system and/or the projection system PS. The intermediate frame may be dynamically isolated from the base frame 260. The intermediate frame may support an encoder head on a first side of the stage 210, whereas the projection system PS is on a second side of the stage 210 opposite to the first side.

The stage 210 has a first center of gravity 330 as indicated in FIG. 3. The crash force 320 may be parallel to the first direction e.g., the x direction. In an embodiment, the first center of gravity 330 and the crash force 320 are aligned parallel to the first direction. For example, the first center of gravity 330 and the crash force 320 are aligned along the x-axis, as indicated with the dashed line in FIG. 3. Alternatively or in addition, the first center of gravity 330 and the crash force 320 are aligned along the y-axis. When aligning the first center of gravity 330 and the crash force 320 parallel to the first direction, the amount of torque generated during a collision between the stage 210 and the balance mass 220 is reduced. By reducing the amount of torque, fewer vibrations are transmitted to the base frame 260. When the stage 210 has only one contact area 310, the crash force 320 is the same as the resultant crash force. When the stage 210 comprises a plurality of contact areas 310, the plurality of crash forces 320 together form the resultant crash force. The resultant crash force may be parallel to the first direction. The first center of gravity 330 and the resultant crash force are aligned parallel to the first direction, for example along the x-axis and/or along the y-axis.

Figure 4:
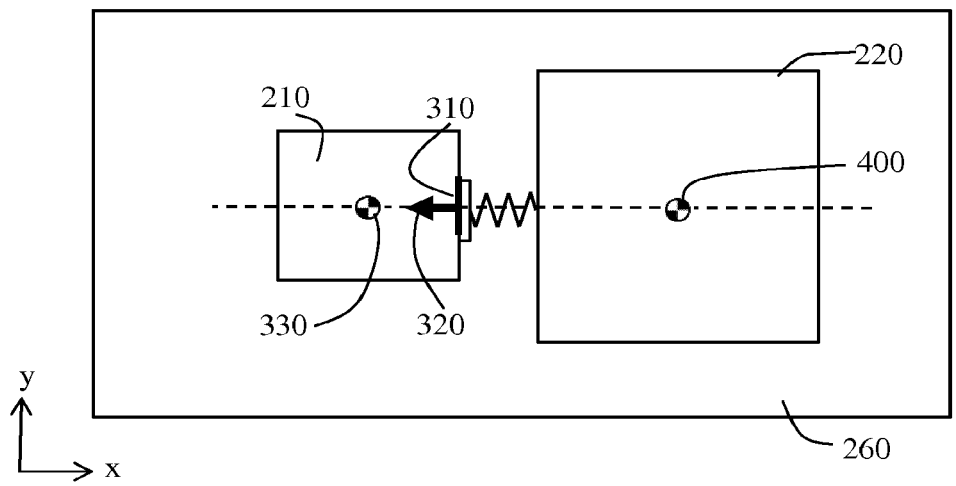
FIG. 4 depicts a positioning system according to a further embodiment.

FIG. 4 shows a view in the xy-plane of an embodiment. FIG. 4 shows the stage 210 colliding into the balance mass 220 with contact area 310. At contact area 310, the crash force 320 is applied by the balance mass 220 on the stage 210 to decelerate the stage 210. The balance mass 220 has a second center of gravity 400. In an embodiment, the first center of gravity 330, the resultant crash force and the second center of gravity 400 are aligned, for example aligned parallel to the first direction. In the case of the stage 210 having only one contact area 310, the resultant crash force is the same as the crash force 320. In the case of the stage 210 having a plurality of contact areas 310, the resultant crash force is formed by the crash forces 320 on the contact areas 310 combined. Aligning the first center of gravity 330, the resultant crash force and the second center of gravity along the first direction may have the benefit that in case the stage 210 collides into the balance mass 220, substantially no momentum is applied to the balance mass 220. By avoiding that a momentum is applied to the balance mass 220, the balance mass 220 is not tilted, for example tilted along the y-axis or along the z-axis. Tilting of the balance mass 220 could cause the balance mass 220 to introduce vibrations in the base frame 260.

Figure 5:
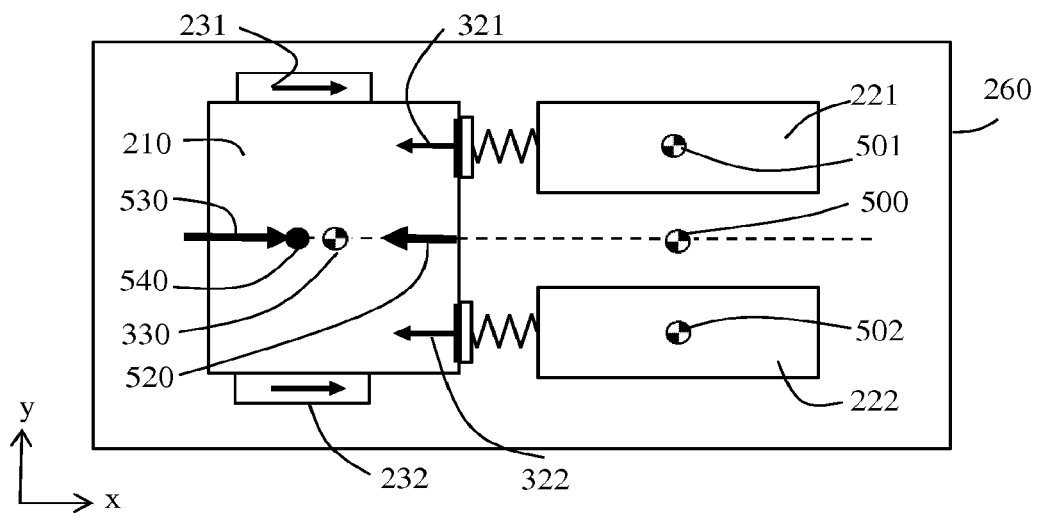
FIG. 5 depicts a positioning system according to a further embodiment.

FIG. 5 shows a view in the xy-plane of a further embodiment. The stage 210 comprises the actuator system 230 to drive the stage 210 in the first direction. The actuator system 230 comprises a first actuator 231 and a second actuator 232. In this embodiment, the first actuator 231 and a second actuator 232 are arranged on opposite sides of the stage 210. The balance mass 220 comprises a plurality of balance mass parts, in this embodiment a first balance mass part 221 and a second balance mass part 222. Each of the balance mass parts may be movable in the second direction relative to each other. The first balance mass part 221 and the second balance mass part 222 may be moveable in the second direction relative to each other. The first balance mass part 221 and the second balance mass part 222 are moveable in the second direction relative to the stage 210. The first balance mass part 221 has a third center of gravity 501. The second balance mass part 222 has a fourth center of gravity 502. When considering the stage 210 and the balance mass 220 as a dynamic system, the third center of gravity 501 and the fourth center of gravity 502 may be combined and be represented by a combined center of gravity 500. The combined center of gravity 500 forms the second center of gravity 400. In this embodiment, the first balance mass part 221 and the second balance mass part 222 have the same size and mass, so the combined center of gravity 500 is in the middle between the first balance mass part 221 and the second balance mass part 222.

The stage 210 is provided with two contact areas 310. During a collision, the resultant crash force 520 is formed by a first crash force 321 and a second crash force 322. The first center of gravity 330 is aligned with the resultant crash force 520 along the first direction. The first center of gravity 330, the resultant crash force 520 and the combined center of gravity 500, which forms the second center of gravity 400, are aligned along the first direction. In the embodiment of FIG. 5, the first center of gravity 330, the resultant crash force 520 and the second center of gravity 400 are aligned along the x-direction. Alternatively or in addition, the first center of gravity 330, the resultant crash force 520 and the second center of gravity 400 are aligned along the y-direction. The stage 210 may collide into the first balance mass part 221 and the second balance mass part 222 simultaneously or may collide first into one of the first balance mass part 221 and the second balance mass part 222 and then into the other of the first balance mass part 221 and the second balance mass part 222.

Each of the first actuator 231 and the second actuator 232 are arranged to generate a drive force in the first direction. The drive force generated by the first actuator 231 may cause the first balance mass part 221 to move in the second direction. The drive force generated by the second actuator 232 may cause the second balance mass part 222 to move in the second direction. The drive force in the first direction generated by the first actuator 231 and the drive force in the first direction generated by the second actuator 232 together form a resultant drive force 530 to drive the stage 210 in the first direction. The resultant drive force 530 is provided at a center of force 540. The center of force 540 and the first center of gravity 330 are aligned along the first direction. In an embodiment, the center of force 540, the first center of gravity 330 and the second center of gravity 400 are aligned along the first direction. In an embodiment, the center of force 540, the first center of gravity 330, the second center of gravity 400 and the resultant crash force 520 are aligned along the first direction. The center of force 540, the first center of gravity 330, the second center of gravity 400 and the resultant crash force 520 may be aligned along the first direction in the xy-plane, the xz-plane, or both the xy-plane and the xz-plane.

The actuator system 230 may comprise a plurality of coils and a plurality of magnets. The plurality of coils may cooperate with the plurality of magnets to create an electromagnetic force to drive the stage 210. In an embodiment, the plurality of coils is arranged on the stage 210 or the balance mass 220 along the first direction. The plurality of magnets is arranged on the other of the stage 210 and the balance mass 220. For example, the first actuator 231 has a plurality of coils, i.e., electric coils, arranged along the x-axis. The plurality of coils may be commutated so the stage 210 may move relative to the balance mass 220 over a large movement range 240. Because of the large movement range 240, the stage 210 has a large space to accelerate and to achieve a high speed. In an emergency, the high speed may cause the stage 210 to collide violently. The positioning system 200 in an embodiment is able to absorb the violent collision and to limit the amount of force transmitted to the base frame 260.

The positioning system 200 may comprise a crash buffer, wherein the crash buffer forms the contact area 310 and/or the second surface 290. The crash buffer may be part of the stage 210, part of the balance mass 220 or be part of both the stage 210 and the balance mass 220. For example, the crash buffer comprises a flexible element and a crash member. The flexible element connects the crash member to the balance mass 220. In an embodiment, the crash member forms the second surface 290 to make contact with the contact area 310 during a collision. Alternatively or additionally, the flexible element connects the crash member to the stage 210. In that case, the crash member may form the contact area 310. The crash buffer may comprise a combination of a spring and a damper to provide the flexible element and to dissipate the kinetic energy of the stage 210.

The flexible element may comprise a spring and/or a damper. The crash buffer is arranged to limit the crash force 320 by providing the crash force 320 over a crash distance. The longer the crash distance, the lower the crash force 320 may be. When the crash distance is large enough, the crash buffer is able to completely stop the stage 210 from moving in the first direction. The crash buffer may be arranged to provide a constant crash force 320 over substantially the entire crash distance.

The crash buffer may be arranged to decelerate the stage 210 at a maximum crash deceleration when the stage 210 collides into the balance mass 220. For example, the flexible element may be dimensioned to have a suitable stiffness to achieve a desired value for the maximum crash deceleration. A high stiffness would result in a high value for the maximum crash deceleration, i.e., the speed of the stage 210 is reduced quickly. A low stiffness would result in a low value for the maximum crash deceleration, i.e., the speed of the stage 210 is reduced slowly.

The actuator system 230 is arranged to accelerate the stage 210 with a maximum drive acceleration. The maximum drive acceleration may be determined by a maximum value of the resultant drive force 530 and a mass of the stage 210. The maximum crash deceleration and the maximum drive acceleration may be substantially equal to each other. The stage 210 is designed to have acceptable stresses and strains during the maximum drive acceleration. By setting the maximum crash deceleration substantially equal to the maximum drive acceleration, the stage 210 may have acceptable stresses and strains during the crash deceleration, while the crash distance is minimized.

The stage 210 may comprise a short-stroke module and a long-stroke module. The actuator system 230 is arranged to move the long-stroke module relative to the balance mass 220. The long-stroke module is arranged to move the short-stroke module relative to the long-stroke module. The short-stroke module is configured to hold the object. The long-stroke module comprises the front surface 280. The long-stroke module comprises the front surface 280 having the contact area 310. The long-stroke module is arranged to collide into the balance mass 220 when the long-stroke module is moving in the first direction and is at the end 250 of the movement range 240. In an embodiment, the short-stroke module comprises the front surface 280. The short-stroke module may be arranged to collide into the balance mass 220 when the short-stroke module is moving in the first direction and is at the end 250 of the movement range 240 relative to the balance mass 220. In an embodiment, both the short-stroke module and the long-stroke module are arranged to collide into the balance mass 220. Alternatively, the short-stroke module may be arranged to collide into the long-stroke module.

The balance mass 220 may be arranged to support the stage 210. In an embodiment, the stage 210 is supported by the base frame 260 or any other suitable frame. The balance mass 220 may be arranged to support the long-stroke module and/or the short-stroke module.

Figure 6:
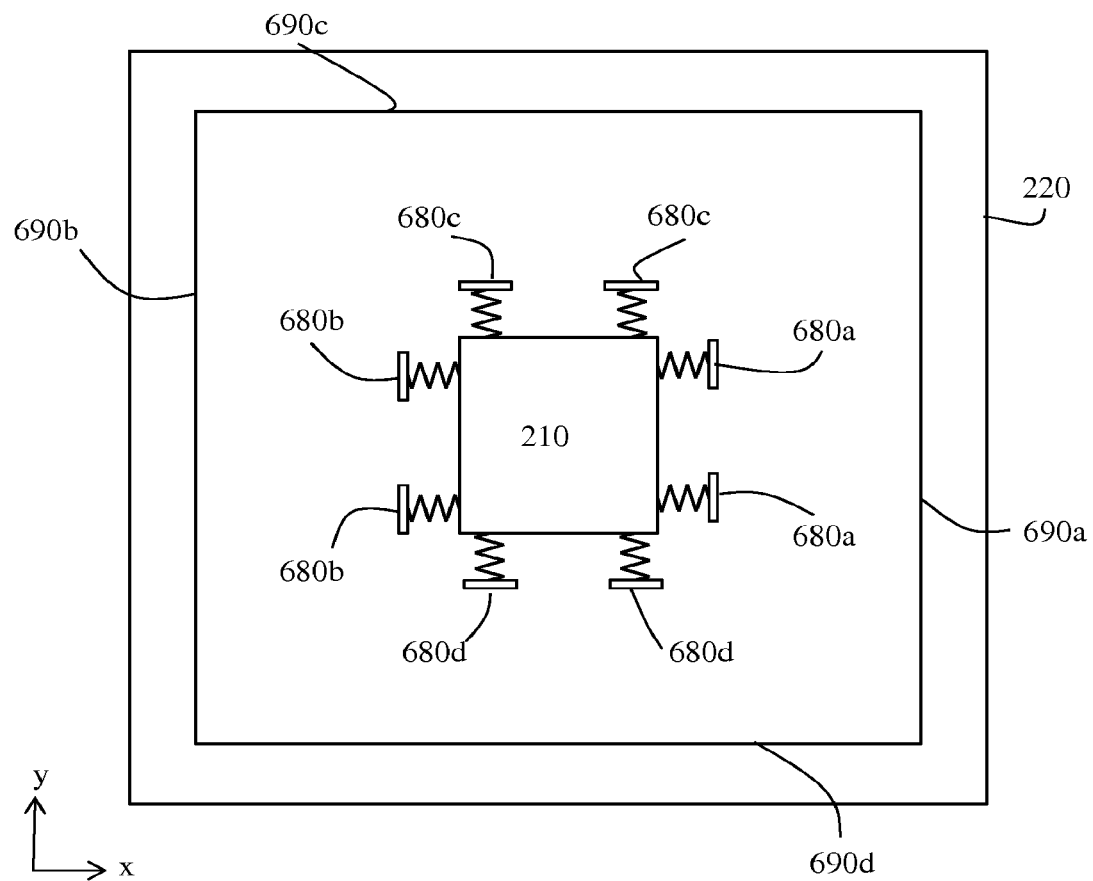
FIG. 6 depicts a positioning system according to a further embodiment.

A further embodiment is shown in FIG. 6 as a top view. The balance mass 220 surrounds the stage 210 in the xy-plane. The xy-plane may be parallel to the surface of the substrate W. The surface of the substrate W has the target portions C. The stage 210 is provided with 8 crash buffers. The balance mass 220 has surfaces 690a, 690b, 690c and 690d, each facing the stage 210. When the stage 210 moves in the +x direction, the surfaces 680a form the front surface 280, and the balance mass 220 moves in the −x direction. When the stage 210 moves in the +x direction and collides into the balance mass 220, the surfaces 680a collide into the surface 690a, which forms the second surface 290. When the stage 210 moves in the −x direction, the surfaces 680b form the front surface 280, and the balance mass 220 moves in the +x direction. When the stage 210 moves in the −x direction and collides into the balance mass 220, the surfaces 680b collide into the surface 690b, which forms the second surface 290. When the stage 210 moves in the +y direction, the surfaces 680c form the front surface 280, and the balance mass 220 moves in the −y direction. When the stage 210 moves in the +y direction and collides into the balance mass 220, the surfaces 680c collide into the surface 690c, which forms the second surface 290. When the stage 210 moves in the −y direction, the surfaces 680d form the front surface 280, and the balance mass 220 moves in the +y direction. When the stage 210 moves in the −y direction and collides into the balance mass 220, the surfaces 680d collide into the surface 690d, which forms the second surface 290.

FIG. 6 shows two surfaces 680a at a distance from each other along the y direction. Having two surfaces 680a at the distance from each other along the y direction has the benefit that the crash buffers can stop an Rz-rotation (a rotation about the z-direction) of the stage 210 when the stage 210 collides with surface 690a. Similarly, the crash buffers can stop an Rz-rotation of the stage 210 when the stage 210 collides with surface 690b, because the two surfaces 680b are at a distance from each other along the y direction. Similarly, the crash buffers can stop an Rz-rotation of the stage 210 when the stage 210 collides with surface 690c, because the two surfaces 680c are at a distance from each other along the x direction. Similarly, the crash buffers can stop an Rz-rotation of the stage 210 when the stage 210 collides with surface 690d, because the two surfaces 680d are at a distance from each other along the x direction.

In the embodiments described above, only a single stage 210 is depicted. Instead of a single stage 210, a plurality of stages 210 may be arranged in the positioning system 200, for example two or three stages 210. The plurality of stages 210 may share a balance mass 220. The resultant drive force 530 of each of the plurality of stages 210 may be applied to the balance mass 220. Due to the conservation of momentum, the movement of the balance mass 220 depends on the movement of the plurality of stages 210. For example, in a situation in which one stage 210 moves in the +x direction and another stage moves in the −x direction, the balance mass 220 may remain at a standstill. So even though the actuator system 230 is arranged to drive one of the stages 210 in the first direction while driving the balance mass in the second direction opposite to the first direction, this does not mean that the balance mass moves in the second direction in all situations.

The balance mass 220 may be supported by the base frame 260 via a flexible element or via a plurality of flexible elements. The flexible element may be flexible in the second direction, for example along the x direction. The flexible elements may be rigid or substantially rigid in another direction, for example the z direction. Alternatively, the flexible elements are flexible in the x, y and z direction. The balance mass may be supported by bearings, such as one or more gas bearings, e.g., one or more air bearings, one or more roller bearings or one or more slide bearings.

The stage 210 described in the embodiments may be arranged to support an object. The object may be the patterning device MA or the substrate W. The object may be an optical component of the projection system PS, such as a mirror or a lens. The stage 210 may move the optical component during exposure of a target portion C.

In an embodiment, there is provided a positioning system for positioning an object, the positioning system comprising: a stage configured to hold the object, the stage being moveable in a first direction in a movement range; a balance mass; and an actuator system configured to drive the stage in the first direction while driving the balance mass in a second direction opposite to the first direction, wherein, when the stage is moving in the first direction and is at an end of the movement range, the positioning system is arranged to collide the stage frontally into the balance mass.

In an embodiment, the actuator system comprises a plurality of coils arranged on the stage or the balance mass, along the first direction. In an embodiment, the stage has a first surface forming a front surface when moving in the first direction, the balance mass has a second surface, and the stage is arranged to collide with the front surface into the second surface. In an embodiment, the front surface has a contact area for contacting with the second surface, the stage has a first center of gravity, when the contact area contacts the second surface, the second surface applies a crash force on the contact area, and the first center of gravity and a resultant crash force are aligned parallel to the first direction. In an embodiment, the balance mass has a second center of gravity, and wherein the first center of gravity, the resultant crash force and the second center of gravity are aligned parallel to the first direction. In an embodiment, the balance mass comprises a plurality of balance mass parts, and a combined center of gravity of the balance mass parts forms the second center of gravity. In an embodiment, the actuator system is configured to provide a resultant drive force at a center of force for driving the stage in the first direction, and wherein the center of force, the first center of gravity, the second center of gravity and the resultant crash force are aligned parallel to the first direction. In an embodiment, the positioning system further comprises a crash buffer, wherein the crash buffer forms the contact area and/or the second surface. In an embodiment, the crash buffer is arranged to decelerate the stage at a maximum crash deceleration when the stage collides into the balance mass, the actuator system is arranged to accelerate the stage with a maximum drive acceleration, and the maximum crash deceleration and the maximum drive acceleration are substantially equal to each other. In an embodiment, the stage comprises a short-stroke module and a long-stroke module, the actuator system is arranged to move the long-stroke module relative to the balance mass, the long-stroke module is arranged to move the short-stroke module relative to the long-stroke module, the short-stroke module is configured to hold the object, and the short-stroke module and/or the long-stroke module comprises the front surface. In an embodiment, the balance mass surrounds the stage. In an embodiment, the positioning system further comprises a base frame configured to support the balance mass, wherein the balance mass is moveable relative to the base frame in the second direction. In an embodiment, the base frame is arranged to support the balance mass via a flexible element, and the flexible element is flexible in the second direction.

In an embodiment, there is provided a lithographic apparatus, comprising: a positioning system as described herein; a support structure constructed to support a patterning device, the patterning device being capable of imparting a radiation beam with a pattern in its cross-section to form a patterned radiation beam; a substrate table constructed to hold a substrate; and a projection system configured to project the patterned radiation beam onto a target portion of the substrate, wherein the stage comprises the support structure and the object comprises the patterning device, or the stage comprises the substrate table and the object comprises the substrate. In an embodiment, the lithographic apparatus comprises a base frame configured to support the balance mass, wherein the balance mass is moveable relative to the base frame in the second direction and the base frame is arranged to support the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device MA defines the pattern created on a substrate. The topography of the patterning device may be pressed into a layer of resist supplied to the substrate whereupon the resist is cured by applying electromagnetic radiation, heat, pressure or a combination thereof. The patterning device MA is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

What is claimed is:

1. A positioning system for positioning an object, the positioning system comprising:
    a stage configured to hold the object, the stage being moveable in a first direction in a movement range and comprising a short-stroke module configured to hold the object and a long-stroke module arranged to move the short-stroke module relative to the long-stroke module;
    a balance mass; and
    an actuator system configured to drive the stage in the first direction while driving the balance mass in a second direction opposite to the first direction and arranged to move the long-stroke module relative to the balance mass, an actuator of the actuator system to drive the stage having a coil on the stage or balance mass and a magnet cooperating with the coil on the other of the stage or balance mass such that a reaction force to driving the stage drives the balance mass in the second direction,
    wherein, when the stage is moving in the first direction and is at an end of the movement range, the positioning system is arranged to collide the stage frontally into the balance mass,
    wherein the stage has a first surface forming a front surface when moving in the first direction, the balance mass has a second surface, and the stage is arranged to collide with the front surface into the second surface, and
    wherein the short-stroke module and/or the long-stroke module comprises the front surface.

2. The positioning system of claim 1, wherein the actuator system comprises a plurality of coils arranged on the stage or the balance mass, along the first direction.

3. The positioning system of claim 1, wherein:
    the front surface has a contact area for contacting with the second surface,
    the stage has a first center of gravity,
    when the contact area contacts the second surface, the second surface applies a crash force on the contact area, and
    the first center of gravity and a direction of the resultant crash force are aligned essentially parallel to the first direction.

4. The positioning system of claim 3, wherein the balance mass has a second center of gravity, and wherein the first center of gravity, the direction of the resultant crash force and the second center of gravity are aligned essentially parallel to the first direction.

5. The positioning system of claim 4, wherein the balance mass comprises a plurality of balance mass parts, and a combined center of gravity of the balance mass parts forms the second center of gravity.

6. The positioning system of claim 4, wherein the actuator system is configured to provide a resultant drive force at a center of force for driving the stage in the first direction, and wherein the center of force, the first center of gravity, the second center of gravity and the direction of the resultant crash force are aligned essentially parallel to the first direction.

7. The positioning system of claim 3, further comprising a crash buffer, wherein the crash buffer forms the contact area and/or the second surface.

8. The positioning system of claim 7, wherein:
the crash buffer is arranged to decelerate the stage at a maximum crash deceleration when the stage collides into the balance mass,
the actuator system is arranged to accelerate the stage with a maximum drive acceleration, and
the maximum crash deceleration and the maximum drive acceleration are substantially equal to each other.

9. The positioning system of claim 1, wherein the balance mass surrounds the stage.

10. The positioning system of claim 1, further comprising a base frame configured to support the balance mass, wherein the balance mass is moveable relative to the base frame in the second direction.

11. The positioning system of claim 10, wherein the base frame is arranged to support the balance mass via a flexible element, and the flexible element is flexible in the second direction.

12. A lithographic apparatus, comprising:
the positioning system of claim 1;
a support structure constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate,
wherein the stage comprises the support structure and the object comprises the patterning device, or the stage comprises the substrate table and the object comprises the substrate.

13. The lithographic apparatus of claim 12, comprising a base frame configured to support the balance mass, wherein the balance mass is moveable relative to the base frame in the second direction and the base frame is arranged to support the projection system.

14. The positioning system of claim 1, further comprising a position measurement system comprising a first subset of encoder heads to determine a position of the stage when the stage is at a first position and a second subset of encoder heads to determine a position of the stage when the stage is at a second position, wherein the second subset has at least one encoder head different from the first subset.

15. The positioning system of claim 1, further comprising a position measurement system comprising a first subset of encoder heads to determine a position of the stage when the stage is at a first position and a second subset of encoder heads to determine a position of the stage when the stage is at a second position, wherein during a switching from use of the first subset to use of the second subset, the position measurement system uses both the first and second subsets to determine the position of the stage.

16. The positioning system of claim 1, further comprising a position measurement system comprising a plurality of encoder heads, wherein the position measurement system comprises a first subset of the plurality of encoder heads to determine a position of the stage when the stage is at a first position, and the position measurement system comprises a second subset of the plurality of encoder heads to determine the position of the stage when the stage is at a second position.

17. A method comprising:
driving a stage in a first direction using an actuator while driving a balance mass in a second direction opposite to the first direction, the stage comprising a short-stroke module configured to hold an object, comprising a long-stroke module moveable relative to the balance mass and arranged to move the short-stroke module relative to the long-stroke module, and being moveable in the first direction in a movement range and the actuator having a coil on the stage or balance mass and a magnet cooperating with the coil on the other of the stage or balance mass such that a reaction force to driving the stage drives the balance mass in the second direction; and
when the stage is moving in the first direction and is at an end of the movement range, colliding the stage frontally into the balance mass
wherein the stage has a first surface forming a front surface when moving in the first direction, the balance mass has a second surface, and the stage is arranged to collide with the front surface into the second surface, and
wherein the short-stroke module and/or the long-stroke module comprises the front surface.

18. The method of claim 17, further comprising:
determining a position of the stage when the stage is at a first position using a first subset of a plurality of encoder heads of a position measurement system; and
determining a position of the stage when the stage is at a second position using a second subset of the plurality of encoder heads of the position measurement system.

19. The method of claim 18, wherein the second subset has at least one encoder head different from the first subset.

20. The method of claim 18, wherein during a switching from use of the first subset to use of the second subset, both the first and second subsets are used to determine the position of the stage.

21. The method of claim 17, wherein:
the front surface has a contact area for contacting with the second surface,
the stage has a first center of gravity,
when the contact area contacts the second surface, the second surface applies a crash force on the contact area, and
the first center of gravity and a direction of the resultant crash force are aligned essentially parallel to the first direction.

22. The method of claim 17, wherein the balance mass surrounds the stage.

* * * * *